(12) United States Patent
Pendse et al.

(10) Patent No.: US 9,125,332 B2
(45) Date of Patent: Sep. 1, 2015

(54) FILP CHIP INTERCONNECTION STRUCTURE WITH BUMP ON PARTIAL PAD AND METHOD THEREOF

(75) Inventors: Rajendra D. Pendse, Fremont, CA (US); Youngcheol Kim, Kyungki-do (KR); TaeKeun Lee, Kyungki-do (KR); GuiChea Na, Kyounggi-do (KR); GwangJin Kim, Kyounggi-do (KR)

(73) Assignee: STATS ChipPAC, Ltd., Singapore (SG)

( * ) Notice: Subject to any disclaimer, the term of this patent is extended or adjusted under 35 U.S.C. 154(b) by 225 days.

(21) Appl. No.: 12/813,335

(22) Filed: Jun. 10, 2010

(65) Prior Publication Data

US 2010/0244245 A1    Sep. 30, 2010

Related U.S. Application Data

(62) Division of application No. 12/055,152, filed on Mar. 25, 2008, now Pat. No. 7,759,137.

(51) Int. Cl.
*H01L 23/48* (2006.01)
*H01L 23/52* (2006.01)
(Continued)

(52) U.S. Cl.
CPC .............. *H05K 3/3452* (2013.01); *H01L 24/81* (2013.01); *H01L 24/03* (2013.01); *H01L 24/05* (2013.01);
(Continued)

(58) Field of Classification Search
CPC ....................................................... H01L 24/81
USPC .......... 257/686, 692, 737, E21.499, E23.068, 257/773, 786, E23.069; 438/14, 15, 25
See application file for complete search history.

(56) References Cited

U.S. PATENT DOCUMENTS 5,378,859 A    1/1995    Shirasaki et al.
5,386,624 A    2/1995    George et al.
(Continued)

FOREIGN PATENT DOCUMENTS

JP    04-355933         9/1992
JP    08340173 A        12/1996
(Continued)

OTHER PUBLICATIONS

Yamada, Hiroshi et al., "Advanced copper column based solder bump for flip-chip interconnection", International Symposium on Microelectronics, 1997, pp. 417-422, The British Library— "The world's knowledge".
(Continued)

*Primary Examiner* — Nitin Parekh
(74) *Attorney, Agent, or Firm* — Robert D. Atkins; Atkins and Associates, P.C.

(57) ABSTRACT

A semiconductor package includes a semiconductor die with a plurality of solder bumps formed on bump pads. A substrate has a plurality of contact pads each with an exposed sidewall. A solder resist is disposed opening over at least a portion of each contact pad. The solder bumps are reflowed to metallurgically and electrically connect to the contact pads. Each contact pad is sized according to a design rule defined by SRO+2*SRR−2X, where SRO is the solder resist opening, SRR is a solder registration for the manufacturing process, and X is a function of a thickness of the exposed sidewall of the contact pad. The value of X ranges from 5 to 20 microns. The solder bump wets the exposed sidewall of the contact pad and substantially fills an area adjacent to the exposed sidewall. The contact pad can be made circular, rectangular, or donut-shaped.

27 Claims, 3 Drawing Sheets

(51) Int. Cl.
*H05K 3/34* (2006.01)
*H01L 23/00* (2006.01)
*H05K 3/00* (2006.01)

(52) U.S. Cl.
CPC ............ *H01L 24/11* (2013.01); *H01L 24/13* (2013.01); *H01L 24/16* (2013.01); *H01L 2224/0332* (2013.01); *H01L 2224/0345* (2013.01); *H01L 2224/0346* (2013.01); *H01L 2224/03464* (2013.01); *H01L 2224/0401* (2013.01); *H01L 2224/05571* (2013.01); *H01L 2224/05573* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/1132* (2013.01); *H01L 2224/1145* (2013.01); *H01L 2224/11334* (2013.01); *H01L 2224/11464* (2013.01); *H01L 2224/11849* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/16013* (2013.01); *H01L 2224/16225* (2013.01); *H01L 2224/16227* (2013.01); *H01L 2224/16237* (2013.01); *H01L 2224/81143* (2013.01); *H01L 2224/81191* (2013.01); *H01L 2224/81192* (2013.01); *H01L 2224/81203* (2013.01); *H01L 2224/81385* (2013.01); *H01L 2224/81411* (2013.01); *H01L 2224/81424* (2013.01); *H01L 2224/81439* (2013.01); *H01L 2224/81444* (2013.01); *H01L 2224/81447* (2013.01); *H01L 2224/81455* (2013.01); *H01L 2224/81815* (2013.01); *H01L 2224/94* (2013.01); *H01L 2924/0002* (2013.01); *H01L 2924/00013* (2013.01); *H01L 2924/0105* (2013.01); *H01L 2924/01006* (2013.01); *H01L 2924/01013* (2013.01); *H01L 2924/01029* (2013.01); *H01L 2924/01033* (2013.01); *H01L 2924/01047* (2013.01); *H01L 2924/01078* (2013.01); *H01L 2924/01079* (2013.01); *H01L 2924/01082* (2013.01); *H01L 2924/01322* (2013.01); *H01L 2924/14* (2013.10); *H01L 2924/30105* (2013.01); *H05K 3/0005* (2013.01); *H05K 3/3436* (2013.01); *H05K 2201/0989* (2013.01); *H05K 2201/10734* (2013.01)

(56) References Cited

U.S. PATENT DOCUMENTS

| | | | |
|---|---|---|---|
| 5,434,410 A | 7/1995 | Kulwicki | |
| 5,508,561 A | 4/1996 | Tago et al. | |
| 5,519,580 A | 5/1996 | Natarajan et al. | |
| 5,650,595 A | 7/1997 | Bentlage et al. | |
| 5,710,071 A | 1/1998 | Beddingfield et al. | |
| 5,844,782 A | 12/1998 | Fukasawa | |
| 5,869,886 A | 2/1999 | Tokuno | |
| 5,872,399 A | 2/1999 | Lee | |
| 5,889,326 A | 3/1999 | Tanaka | |
| 5,915,169 A | 6/1999 | Heo | |
| 5,977,632 A | 11/1999 | Beddingfield | |
| 5,985,456 A | 11/1999 | Zhou et al. | |
| 6,157,079 A * | 12/2000 | Taguchi | 257/737 |
| 6,201,305 B1 * | 3/2001 | Darveaux et al. | 257/779 |
| 6,218,630 B1 | 4/2001 | Takigami | |
| 6,228,466 B1 | 5/2001 | Tsukada et al. | |
| 6,259,163 B1 | 7/2001 | Ohuchi et al. | |
| 6,281,450 B1 | 8/2001 | Urasaki et al. | |
| 6,297,560 B1 | 10/2001 | Capote et al. | |
| 6,324,754 B1 | 12/2001 | DiStefano et al. | |
| 6,329,605 B1 | 12/2001 | Beroz et al. | |
| 6,335,568 B1 | 1/2002 | Yuzawa et al. | |
| 6,335,571 B1 | 1/2002 | Capote et al. | |
| 6,396,707 B1 | 5/2002 | Huang et al. | |
| 6,441,316 B1 | 8/2002 | Kusui | |
| 6,448,665 B1 | 9/2002 | Nakazawa et al. | |
| 6,573,610 B1 * | 6/2003 | Tsai | 257/780 |
| 6,600,234 B2 | 7/2003 | Kuwabara et al. | |
| 6,608,388 B2 | 8/2003 | Lin et al. | |
| 6,636,313 B2 * | 10/2003 | Chen et al. | 356/401 |
| 6,710,458 B2 | 3/2004 | Seko | |
| 6,734,557 B2 | 5/2004 | Taniguchi et al. | |
| 6,756,294 B1 | 6/2004 | Chen et al. | |
| 6,774,497 B1 | 8/2004 | Qi et al. | |
| 6,780,673 B2 | 8/2004 | Venkateswaran | |
| 6,787,918 B1 | 9/2004 | Tsai et al. | |
| 6,790,759 B1 * | 9/2004 | Wang et al. | 438/612 |
| 6,809,262 B1 | 10/2004 | Hsu | |
| 6,818,545 B2 | 11/2004 | Lee et al. | |
| 6,849,944 B2 | 2/2005 | Murtuza et al. | |
| 6,870,276 B1 | 3/2005 | Moxham et al. | |
| 6,888,255 B2 | 5/2005 | Murtuza et al. | |
| 6,913,948 B2 | 7/2005 | Caletka et al. | |
| 6,940,179 B2 * | 9/2005 | Lee | 257/780 |
| 7,005,585 B2 | 2/2006 | Ishizaki | |
| 7,005,750 B2 | 2/2006 | Liu | |
| 7,049,705 B2 | 5/2006 | Huang | |
| 7,057,284 B2 | 6/2006 | Chauhan et al. | |
| 7,064,435 B2 | 6/2006 | Chung et al. | |
| 7,098,407 B2 * | 8/2006 | Kim et al. | 174/257 |
| 7,102,239 B2 | 9/2006 | Pu et al. | |
| 7,173,828 B2 | 2/2007 | Lin et al. | |
| 7,224,073 B2 | 5/2007 | Kim | |
| 7,242,099 B2 | 7/2007 | Lin et al. | |
| 7,271,484 B2 | 9/2007 | Reiss et al. | |
| 7,294,929 B2 | 11/2007 | Miyazaki | |
| 7,317,245 B1 | 1/2008 | Lee et al. | |
| 7,405,484 B2 | 7/2008 | Usui et al. | |
| 7,436,063 B2 | 10/2008 | Miyata et al. | |
| 7,521,284 B2 | 4/2009 | Miranda et al. | |
| 7,642,660 B2 | 1/2010 | Tay et al. | |
| 7,670,939 B2 | 3/2010 | Topacio et al. | |
| 7,671,454 B2 | 3/2010 | Seko | |
| 7,732,913 B2 | 6/2010 | Hsieh et al. | |
| 7,750,457 B2 | 7/2010 | Seko | |
| 7,790,509 B2 | 9/2010 | Gerber et al. | |
| 7,791,211 B2 | 9/2010 | Chen et al. | |
| 7,847,399 B2 | 12/2010 | Masumoto | |
| 7,847,417 B2 | 12/2010 | Araki et al. | |
| 7,851,928 B2 | 12/2010 | Gallegos et al. | |
| 7,898,083 B2 | 3/2011 | Castro | |
| 7,902,660 B1 | 3/2011 | Lee et al. | |
| 7,902,678 B2 | 3/2011 | Ohuchi et al. | |
| 7,902,679 B2 | 3/2011 | Lin et al. | |
| 7,932,170 B1 | 4/2011 | Huemoeller et al. | |
| 7,947,602 B2 | 5/2011 | Ito et al. | |
| 2002/0034888 A1 | 3/2002 | Edwards et al. | |
| 2004/0056341 A1 | 3/2004 | Endo et al. | |
| 2004/0232562 A1 | 11/2004 | Hortaleza et al. | |
| 2005/0023679 A1 * | 2/2005 | Liu | 257/737 |
| 2005/0103516 A1 | 5/2005 | Kaneyuki | |
| 2005/0110164 A1 | 5/2005 | Pendse | |
| 2005/0248037 A1 | 11/2005 | Hung et al. | |
| 2006/0131758 A1 | 6/2006 | Dao | |
| 2007/0096327 A1 * | 5/2007 | Kawamura et al. | 257/774 |
| 2007/0158838 A1 | 7/2007 | Fujii | |
| 2007/0200234 A1 | 8/2007 | Gerber et al. | |
| 2008/0006921 A1 | 1/2008 | Park et al. | |
| 2008/0023829 A1 * | 1/2008 | Kok et al. | 257/737 |
| 2008/0093749 A1 | 4/2008 | Gerber et al. | |
| 2008/0179740 A1 | 7/2008 | Liao | |
| 2008/0277802 A1 | 11/2008 | Tsai et al. | |
| 2009/0108445 A1 | 4/2009 | Liang | |
| 2009/0114436 A1 | 5/2009 | Chen et al. | |
| 2009/0152716 A1 | 6/2009 | Sohara | |
| 2009/0184420 A1 | 7/2009 | Choi et al. | |

(56) References Cited

U.S. PATENT DOCUMENTS

| | | |
|---|---|---|
| 2009/0191329 A1 | 7/2009 | Wang |
| 2009/0288866 A1 | 11/2009 | Tsai et al. |
| 2009/0308647 A1 | 12/2009 | Liao |
| 2010/0139965 A1 | 6/2010 | Wang et al. |
| 2011/0049703 A1 | 3/2011 | Hsu et al. |

FOREIGN PATENT DOCUMENTS

| | | |
|---|---|---|
| JP | 10-256307 | 9/1998 |
| JP | 11126795 A | 5/1999 |
| JP | 2000-031204 | 1/2000 |
| JP | 2004-221205 | 5/2004 |
| JP | 2005079211 A | 3/2005 |
| JP | 2007184381 A | 7/2007 |
| JP | 2008535225 A | 8/2008 |
| JP | 2009177118 A | 8/2009 |
| JP | 2010051118 A | 3/2010 |
| WO | 2006/105015 A3 | 10/2006 |

OTHER PUBLICATIONS

Yamada, Hiroshi et al., "A fine pitch and high aspect ratio bump array for flip-chip interconnection", Int'l Electronics Manufacturing Technology Symposium, 1992, pp. 288-292, IEEE/CHMT.

Lu, H. et al., "Predicting Optimal Process Conditions for Flip-Chip Assembly Using Copper Column Bumped Dies", Electronics Packaging Technology Conference, 2002, pp. 338-343.

Kawahara, Toshimi, "SuperCSP", IEEE Transactions on Advanced Packaging, May 2000, pp. 215-219, vol. 23, No. 2.

Son, Ho-Young, "Studies on the Thermal Cycling Reliability of Fine Pitch Cu/SnAg Double-Bump Flip Chip Assemblies on Organic Substrates: Experimental Results and Numerical Analysis", IEEE Electronic Components and Technology Conference, 2008, pp. 2035-2043.

* cited by examiner

FILP CHIP INTERCONNECTION STRUCTURE WITH BUMP ON PARTIAL PAD AND METHOD THEREOF

CLAIM TO DOMESTIC PRIORITY

The present application is a division of U.S. patent application Ser. No. 12/055,152, filed Mar. 25, 2008, and claims priority to the foregoing parent application pursuant to 35 U.S.C. §120.

FIELD OF THE INVENTION

The present invention relates in general to semiconductor packages and, more particularly, to a flip chip interconnect structure having a bump on a partial pad.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level packages (WLP) are ideally suited for ICs demanding high speed, high density, and greater pin count. Flip chip style packaging involves mounting the active side of the die facedown toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on metal contact pads which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

Figure 1:
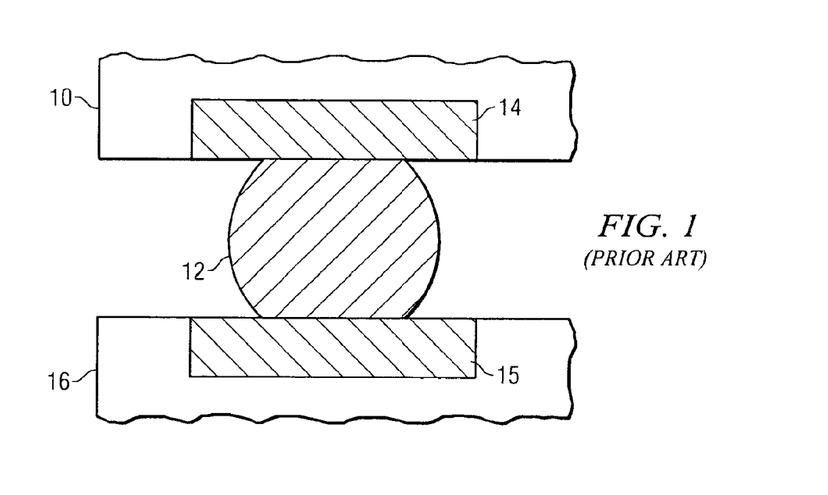
FIG. 1 is a conventional solder bump interconnect to a contact pad on a flip chip.
Figure 2A:
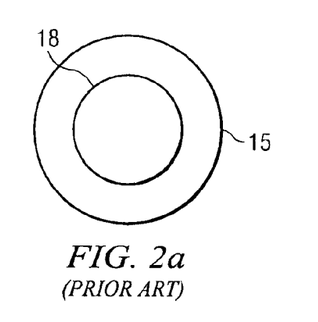
FIGS. 2a-2b illustrate a conventional alignment design rule for a solder resist opening over the contact pad.
Figure 2B:
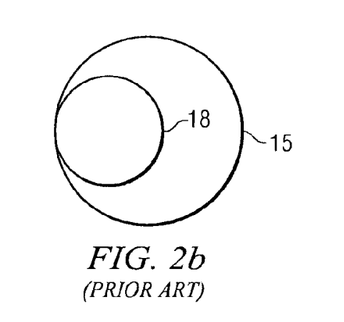

FIG. 1 illustrates a portion of flip chip 10 with a solder bump 12 formed on metal contact pad 14. The solder bump 12 is then metallurgically and electrically connected to metal contact pad 15 on substrate 16 using a solder reflow process. To connect solder bump 12 and contact pad 15, a solder resist or mask opening 18 is disposed over a surface of the substrate to confine the solder reflow to the physical boundaries of contact pad 15, see FIG. 2a. Due to manufacturing alignment tolerances as to the relative position between contact pad 15 and solder resist opening 18, contact pad 15 is made substantially larger than solder resist opening 18 to ensure that the full metal area of the contact pad is exposed, given the alignment tolerance of the solder resist opening. In generally, the minimum size of contact pad 15 is $P_{min}=SRO+2*SRR$, where SRO is the minimum solder resist opening required to ensure good metallurgical connection and SRR is the solder resist alignment tolerance, also known as solder registration. In one example, if solder resist opening 18 is 90 microns and the solder resist alignment tolerance is 25 microns, then, according to the known design rule, contact pad 15 is made 140 microns in diameter. Thus, under the known design rule, and given the maximum manufacturing alignment tolerance, the solder resist opening always falls within the contact pad and leaves no voids or empty space around the pad, as shown in FIG. 2b.

Unfortunately, the larger contact pad required to ensure that the solder resist opening always falls within the full metal area of the contact pad limits the metal signal trace or track routing density that can be achieved on the substrate. The larger contact pad necessarily reduces trace routing density as fewer traces can be placed between the contact pads. In addition, the larger contact pad translates to fewer contacts pads per unit area of the substrate.

SUMMARY OF THE INVENTION

A need exists to minimize the contact pad size to increase trace routing density without impacting electrical functionality or manufacturing reliability. Accordingly, in one embodiment, the present invention is a semiconductor device comprising a semiconductor die having a plurality of bumps formed on bump pads. A substrate has a plurality of contact pads each with an exposed sidewall. An opening is disposed over at least a portion of each contact pad. The bumps are metallurgically and electrically connected to the contact pads. Each contact pad is sized according to a design rule defined by SRO+2*SRR−2X, where SRO is the opening, SRR is a registration for the manufacturing process, and X is a function of a thickness of the exposed sidewall of the contact pad.

In another embodiment, the present invention is a semiconductor device comprising a substrate having a contact pad with an exposed sidewall. An opening is disposed over at least a portion of the contact pad. The contact pad is sized such that the opening extends over the substrate by a maximum distance of X which is a function of a thickness of the exposed sidewall of the contact pad.

In another embodiment, the present invention is a semiconductor device comprising a semiconductor die having a bump formed on a bump pad. A substrate has a contact pad with an exposed sidewall. An opening is disposed over at least a portion of the contact pad. The opening extends over a portion of the substrate by a maximum distance of X which is a function of a thickness of the exposed sidewall of the contact pad. The bump is electrically connected to the contact pad. The bump extends down the exposed sidewall of the contact pad.

In another embodiment, the present invention is a semiconductor device comprising a semiconductor die having a bump formed on a bump pad. A substrate has a contact pad with an exposed sidewall. An opening is disposed over at least a portion of the contact pad. The contact pad is sized such that the opening extends over the substrate by a maximum distance of X which is a function of a thickness of the exposed sidewall of the contact pad.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 3:
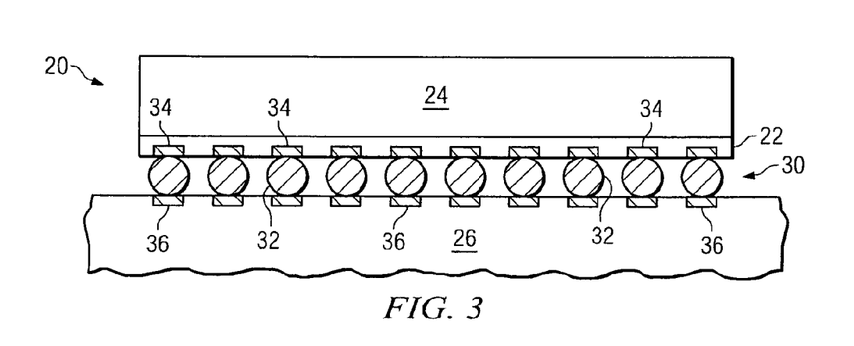
FIG. 3 is a flip chip semiconductor device with bumps providing electrical interconnect between an active area of the die and a chip carrier substrate.

Flip chip semiconductor packages and wafer level packages (WLP) are commonly used with integrated circuits (ICs) demanding high speed, high density, and greater pin count. Flip chip style semiconductor device or package 20 involves mounting an active area 22 of die 24 facedown toward a chip carrier substrate or printed circuit board (PCB) 26, as shown in FIG. 3. Active area 22 contains active and passive devices, conductive layers, and dielectric layers according to the electrical design of the die. The bump pads 34 are formed on active area 22 using an evaporation, electrolytic plating, electroless plating, screen printing, or other suitable metal deposition process. Bump pads 34 connect to the active and passive circuits by conduction tracks in active area 22. The contact pad 36 can be aluminum (Al), tin (Sn), nickel (Ni), gold (Au), silver (Ag), or copper (Cu). The electrical and mechanical interconnect is achieved through a solder bump structure 30. A solder material is deposited on bump pads 34 using an evaporation, electrolytic plating, electroless plating, ball drop, or screen printing process with any metal or electrically conductive material, e.g., Sn, lead (Pb), Ni, Au, Ag, Cu, bismuthinite (Bi), and alloys thereof. For example, the solder material can be eutectic Sn/Pb, high lead, or lead free. The solder material is reflowed to form solder bumps or balls 32. The solder bumps 32 are electrically and mechanically connected to contact pads or interconnect sites 36 on carrier substrate 26 by a solder reflow process. The flip chip semiconductor device provides a short electrical conduction path from the active devices on die 24 to conduction tracks on carrier substrate 26 in order to reduce signal propagation, lower capacitance, and achieve overall better circuit performance.

Figure 4A:
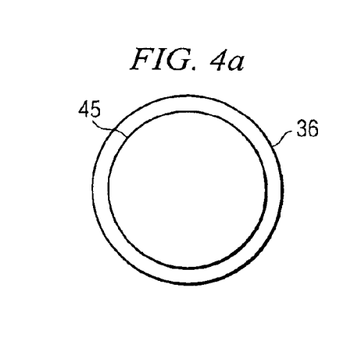
FIGS. 4a-4d illustrate a contact pad reduced in size by a 2X reduced design rule which allows for misalignment between the contact pad and solder resist opening.
Figure 4B:
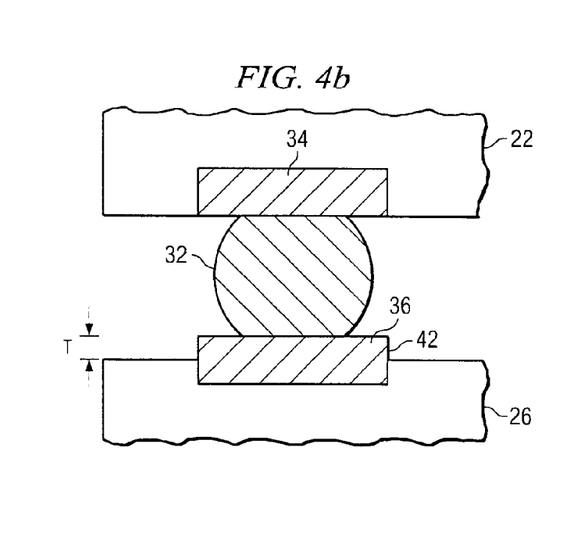
Figure 4C:
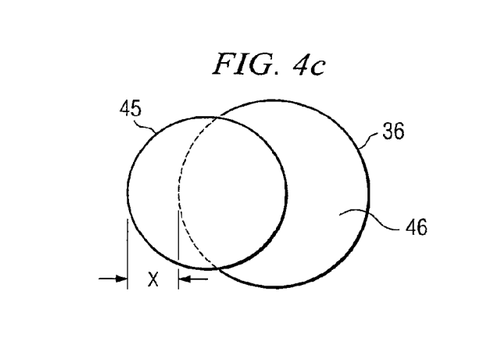
Figure 4D:
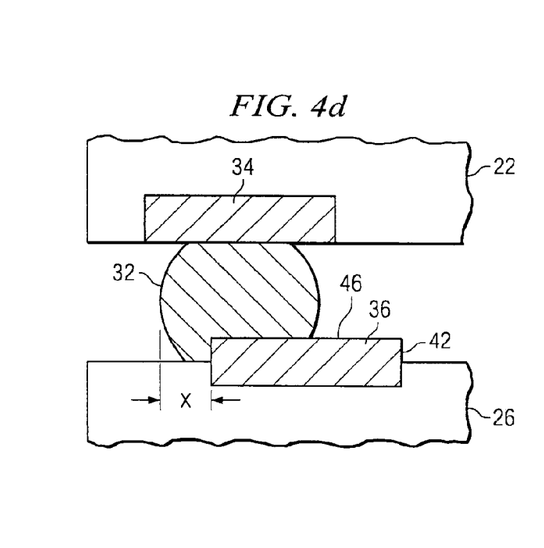

Further detail of the solder bump connection to the substrate contact pad is shown in FIGS. 4a-4d. Solder bump 32 is formed on bump pad 34 in active area 22 of semiconductor die 24, as described above. Metal contact pad 36 is formed on substrate 26 using an evaporation, electrolytic plating, electroless plating, screen printing, or other suitable metal deposition process. The contact pad 36 can be Al, Cu, Sn, Ni, Au, or Ag. Contact pad 36 has a sidewall 42 with an exposed thickness T. In FIG. 4a, a solder resist or mask opening 45 is disposed over at least a portion of contact pad 36. Depending on its alignment, the solder resist opening 45 may extend over a portion of substrate 26, as shown in FIG. 4c. To electrically and metallurgically connect solder bump 32 to contact pad 36, the solder bump is reflowed through solder resist opening 45 onto the contact pad, as shown in FIGS. 4b and 4d.

In another embodiment, solder material can be deposited through the solder resist opening 45 directly onto contact pad 36 on substrate 26 using an evaporation, electrolytic plating, electroless plating, ball drop, or screen printing process with any metal or electrically conductive material, e.g., Sn, Pb, Ni, Au, Ag, Cu, Bi, and alloys thereof. The solder material is reflowed to form a solder bump, as described above.

The manufacturing process for semiconductor device 20 employs a new design rule including a solder registration (SRR) which defines an alignment tolerance for the solder resist opening. Under the new design rule, the solder resist opening need not necessarily be aligned within the contact pad, but rather can be offset or misaligned with respect to the physical area of the contact pad due to manufacturing alignment tolerances.

FIGS. 4a and 4b show the ideal case where solder resist opening 45 is substantially aligned to a center region of contact pad 36. In practice, contact pad 36 may be misaligned with respect to solder resist opening 45 during the manufacturing process. For example, in FIG. 4c, the solder registration in combination with the smaller contact pad results in solder resist opening 45 extending outside the footprint of contact pad 36 by a distance of X. That is, solder resist opening 45 is offset or misaligned to the physical area of contact pad 36. The new design rule allows for this misalignment between contact pad 36 on substrate 26 and solder resist opening 45. During the wetting process, the surface tension of the solder flux material causes the solder bump 32 to reflow across and adhere to surface 46 of contact pad 36. In cases where contact pad 36 is misaligned with solder resist opening 45, i.e. a portion of the contact pad extends outside the solder resist opening, the reflow of solder bump 32 also overlaps and wets sidewall 42 of contact pad 36 to substantially fill the area adjacent to sidewall 42, as seen in FIG. 4d. The solder bump 32 leaves no void or empty space around contact pad 36, including sidewall 42. In either case, under the present design rule, solder bump 32 makes good metallurgical and electrical connection to contact pad 36.

As a feature of the present invention, the contact pad 36 is made smaller, relative to solder resist opening 45, as compared to dimensions and design rules found in the prior art. In general, the contact pad 36 is sized according to the following design rule:

$$P_{size} = SRO + 2*SRR - 2X \quad (1)$$

where:
SRO is solder resist opening,
SRR is solder registration or manufacturing alignment tolerance, and
X is a design rule defining the amount by which the solder bump can overlap the edge and sidewall of the contact pad The new design rule reduces the size of contact pad 36 by 2X in accordance with equation (1). The value of X is a function of the flux material and thickness of contact pad 36. In general, the value of X ranges from one to two times the thickness of the exposed sidewall of the contact pad. The exposed portion of contact pad 36 (T) is typically 5-20 microns in thickness. The value of X can increase with flux effectiveness. Accordingly, given a 90-micron solder resist opening and a 25-micron solder resist alignment tolerance, contact pad 36 can be made 120 microns, assuming a design rule with X=10 microns. In another example, given a 90-micron solder resist opening and a 25-micron solder resist alignment tolerance, contact pad 36 can be made 60 microns, assuming a design rule with X=40 microns. In practice, the contact pad typically includes a size equal to or smaller than the solder resist opening. In other cases, the contact pad can be larger than the solder resist opening.

The 2X reduced design rule of equation (1) provides smaller contact pads which provides for more contact pads per unit area of the substrate. In addition, the smaller contact pads provide more space for signal trace routing between the contact pads, thereby increasing trace routing density. The 2X design rule maintains reliability of the metallurgical connection and electrical functionality of the semiconductor device. The reflowed solder material adhering to sidewall 42 increases the metallurgical integrity and reliability of interconnection by providing more solder contact area. Since the solder material wets to sidewall 42, little or no voids are formed between the solder bump and sidewall 42. The area of substrate 26 immediately around contact pad 36 is electrically isolated to avoid shorting the solder bump to adjacent traces or devices.

Figures 5A, 5B:
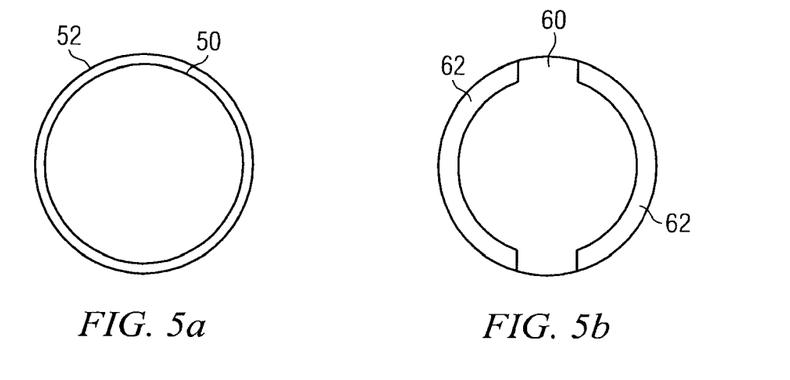
FIGS. 5a-5d illustrate alternate shapes for the contact pad subject to the 2X reduced design rule.

FIG. 5a shows contact pad 50 with a circular shape that is made the same size or slightly smaller than solder resist or mask opening 52. In this case, the overlap or wetting of the sidewall of the contact pad occurs completely around the circumference of the contact pad. Alternatively, the contact pad can be made larger than the solder resist opening.

In FIG. 5b, contact pad 60 is shown with a generally circular shape and narrow trace lines extending from the pad. The trace lines are substantially narrower than solder resist opening 62. The overlap or wetting of the sidewall of the contact pad occurs substantially around the circumference of the contact pad.

Figure 5C:
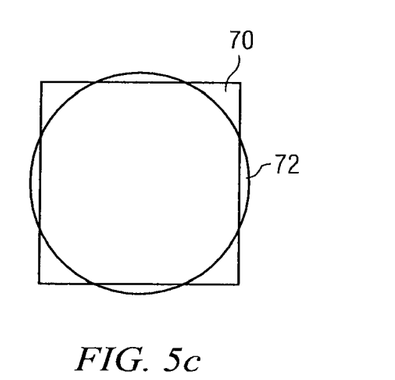

In FIG. 5c, contact pad 70 is made rectangular to further reduce the exposed volume when solder resist opening 72 is misaligned.

Figure 5D:
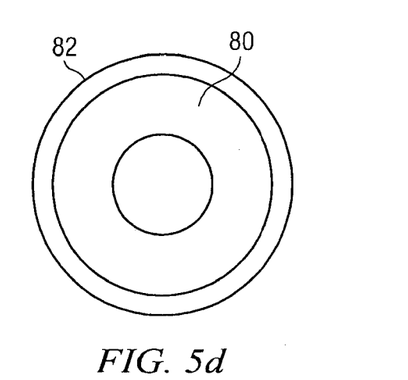

In FIG. 5d, a donut-shaped contact pad 80 provides for wetting of the solder material through solder resist opening 82 on the inner and outer sidewalls of the contact pad. Contact pad 80 reduces the wettable surface area of the pad and provides higher standoff after solder joint is formed.

In summary, given the alignment tolerance for the solder resist opening, the solder bump will necessary overlap the contact pad in at least some of the manufactured semiconductor devices. By employing the 2X reduced design rule that reduces the contact pad size according to equation (1) and allows the solder material to overlap and wet sidewall 42, the contact pads can be made smaller in size which provides for placement of more signal traces between the contact pads. The signal trace routing density correspondingly increases. In addition, the smaller contact pads translate to more pads per unit area of the substrate. From the prior art design rule discussed in the background, which resulted in a 140-micron contact pad with a 90-micron solder resist opening, the 2X reduced design rule substantially reduces the contact pad by 2X.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a semiconductor die including a plurality of bumps formed over the semiconductor die;
a substrate including a plurality of contact pads with the bumps contacting a sidewall of the contact pads; and
an insulating layer formed over the substrate and a portion of each contact pad, the insulating layer including a plurality of openings over and misaligned with the contact pads, wherein each contact pad includes a diameter defined by a design rule SRO+2*SRR−2X, where SRO is a width of the opening, SRR is a registration of the opening, and X is a maximum distance an opening extends outside a footprint of a respective contact pad.

2. The semiconductor device of claim 1, wherein a value of X ranges from 5 to 20 microns.

3. The semiconductor device of claim 1, wherein a diameter of each contact pad is equal to a diameter of a corresponding opening.

4. The semiconductor device of claim 1, wherein a diameter of each contact pad is smaller than a diameter of a corresponding opening.

5. The semiconductor device of claim 1, wherein a diameter of each contact pad is larger than a diameter of a corresponding opening.

6. The semiconductor device of claim 1, wherein each bump substantially fills an area adjacent to the sidewall of a contact pad.

7. The semiconductor device of claim 1, wherein the contact pads are circular, rectangular, or donut-shaped.

8. The semiconductor device of claim 1, wherein the distance X is one to two times a thickness of a portion of the sidewall of the contact pads over a surface of the substrate.

9. A semiconductor device, comprising:
a substrate including a contact pad; and
an insulating layer including an opening formed over the substrate and misaligned with respect to the contact pad, wherein the opening is formed over a first continuous portion of a sidewall of the contact pad while the insulating layer remains over a second continuous portion of the sidewall of the contact pad and the first continuous portion of the sidewall contacts the second continuous portion at two different locations.

10. The semiconductor device of claim 9, wherein the contact pad includes a width defined by a design rule SRO+

2*SRR−2X, where SRO is a width of the opening, X is a maximum distance the opening extends outside a footprint of the contact pad, and SRR is a registration of the opening.

11. The semiconductor device of claim 10, wherein the distance X ranges from 5 to 20 microns.

12. The semiconductor device of claim 10, wherein the distance X is one to two times a thickness of a portion of the sidewall of the contact pad over a surface of the substrate.

13. The semiconductor device of claim 9, further including a semiconductor die comprising an interconnect structure connected to the contact pad.

14. The semiconductor device of claim 9, further including an interconnect structure formed through the opening over the contact pad.

15. The semiconductor device of claim 9, wherein a size of the contact pad is equal to a size of the opening.

16. The semiconductor device of claim 9, wherein a size of the contact pad is smaller or larger than a size of the opening.

17. A semiconductor device, comprising:
   a semiconductor die including an interconnect structure;
   a substrate including a contact pad, wherein the interconnect structure contacts an outer sidewall of the contact pad; and
   an opening disposed over a first portion of the outer sidewall while a second portion of the outer sidewall opposite the first portion of the outer sidewall extends outside a footprint of the opening.

18. The semiconductor device of claim 17, wherein the contact pad includes a width defined by a design rule SRO+2*SRR−2X, where SRO is a width of the opening, X is a maximum distance the opening extends outside a footprint of the contact pad, and SRR is a registration of the opening.

19. The semiconductor device of claim 18, wherein a value of X ranges from 5 to 20 microns.

20. The semiconductor device of claim 17, wherein a size of the contact pad is equal to a size of the opening.

21. The semiconductor device of claim 17, wherein a size of the contact pad is smaller or larger than a size of the opening.

22. A semiconductor device, comprising:
   a substrate including a contact pad comprising a generally circular shape;
   an opening disposed over the substrate and an outer sidewall of the contact pad, wherein the contact pad extends outside a footprint of the opening; and
   a semiconductor die comprising an interconnect structure electrically connected to the contact pad with the interconnect structure contacting the outer sidewall of the contact pad.

23. The semiconductor device of claim 22, wherein the contact pad includes a width defined by a design rule SRO+2*SRR−2X, where SRO is a width of the opening, X is a maximum distance the opening extends outside a footprint of the contact pad, and SRR is a registration of the opening.

24. The semiconductor device of claim 23, wherein a value of X ranges from 5 to 20 microns.

25. The semiconductor device of claim 22, wherein a size of the contact pad is equal to a size of the opening.

26. The semiconductor device of claim 22, wherein a size of the contact pad is smaller or larger than a size of the opening.

27. The semiconductor device of claim 23, wherein the distance X is one to two times a thickness of a portion of the outer sidewall of the contact pad over a surface of the substrate.

* * * * *

UNITED STATES PATENT AND TRADEMARK OFFICE
CERTIFICATE OF CORRECTION

PATENT NO. : 9,125,332 B2  Page 1 of 1
APPLICATION NO. : 12/813335
DATED : September 1, 2015
INVENTOR(S) : Rajendra D. Pendse It is certified that error appears in the above-identified patent and that said Letters Patent is hereby corrected as shown below:

Title Page, item (54) and in the Specification, Column 1, lines 1-3, should read, -- FLIP -- CHIP INTERCONNECTION STRUCTURE WITH BUMP ON PARTIAL PAD AND METHOD THEREOF Signed and Sealed this
Twenty-ninth Day of December, 2015

Michelle K. Lee
*Director of the United States Patent and Trademark Office*